(12) United States Patent
Chen

(10) Patent No.: US 10,797,254 B2
(45) Date of Patent: Oct. 6, 2020

(54) METHOD OF MANUFACTURING ORGANIC SEMICONDUCTOR DEVICE

(71) Applicant: Shenzhen China Star Optoelectronics Semiconductor Display Technology Co., Ltd., Shenzhen (CN)

(72) Inventor: Lixuan Chen, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/462,530

(22) PCT Filed: Sep. 14, 2018

(86) PCT No.: PCT/CN2018/105621
§ 371 (c)(1),
(2) Date: May 21, 2019

(87) PCT Pub. No.: WO2020/042239
PCT Pub. Date: Mar. 5, 2020

(65) Prior Publication Data
US 2020/0176697 A1    Jun. 4, 2020

(30) Foreign Application Priority Data
Aug. 31, 2018 (CN) .......................... 2018 1 1007229

(51) Int. Cl.
*H01L 51/05* (2006.01)
*H01L 51/10* (2006.01)

(52) U.S. Cl.
CPC .......... *H01L 51/055* (2013.01); *H01L 51/052* (2013.01); *H01L 51/0541* (2013.01); *H01L 51/105* (2013.01)

(58) Field of Classification Search
CPC ............. H01L 51/5253; H01L 27/3258; H01L 51/0012; H01L 51/0541
See application file for complete search history.

(56) References Cited

U.S. PATENT DOCUMENTS

| 2008/0121875 A1* | 5/2008 | Kim ...................... H01L 51/052 257/40 |
| 2010/0096620 A1 | 4/2010 | Kao et al. |
| 2010/0127269 A1* | 5/2010 | Daniel ................ H01L 29/1606 257/66 |
| 2010/0171138 A1* | 7/2010 | Yamazaki .............. H05B 33/12 257/98 |
| 2016/0380201 A1 | 12/2016 | Li |

FOREIGN PATENT DOCUMENTS

| CN | 101783393 | 7/2010 |
| CN | 105098074 | 11/2015 |

\* cited by examiner

*Primary Examiner* — Changhyun Yi

(57) ABSTRACT

A method of manufacturing an organic semiconductor device is provided. The method includes providing a substrate, forming a sacrificial layer on the substrate, forming a patterned organic semiconductor layer on the sacrificial layer, forming an insulating layer on the patterned organic semiconductor layer, forming a gate electrode on the insulating layer, separating the sacrificial layer and the substrate from the patterned organic semiconductor layer, and forming a source/drain electrode on the patterned organic semiconductor layer, so as to provide a simple and effective method of manufacturing the organic semiconductor device.

16 Claims, 2 Drawing Sheets

METHOD OF MANUFACTURING ORGANIC SEMICONDUCTOR DEVICE

RELATED APPLICATIONS

This application is a National Phase of PCT Patent Application No. PCT/CN2018/105621 having International filing date of Sep. 14, 2018, which claims the benefit of priority of Chinese Patent Application No. 201811007229.2 filed on Aug. 31, 2018. The contents of the above applications are all incorporated by reference as if fully set forth herein in their entirety.

FIELD AND BACKGROUND OF THE INVENTION

The present disclosure relates to the field of display technologies, and more particularly to a method of manufacturing an organic semiconductor device.

In current technology, a method of manufacturing an organic semiconductor device uses organic material and a copper mask as a protective layer to protect an organic semiconductor layer. In one technical solution of the current technology, in order to effectively protect the organic semiconductor layer, an additional organic coating process and a thermal evaporation process of the copper mask are added, which are complicated.

Therefore, there is a need to provide a method of manufacturing an organic semiconductor device to solve the above technical problems in the current technology.

SUMMARY OF THE INVENTION

In order to solve the above technical problems, an object of the present disclosure is to provide a simple and effective method of manufacturing an organic semiconductor device.

To achieve the above object, an embodiment of the present disclosure provides a method of manufacturing an organic semiconductor device. The method includes providing a substrate, forming a sacrificial layer on the substrate, performing a patterned surface treatment to the sacrificial layer, forming a patterned lyophobic area on the sacrificial layer, forming a patterned organic semiconductor layer on the sacrificial layer, forming an insulating layer on the patterned organic semiconductor layer, forming a gate electrode on the insulating layer, separating the sacrificial layer and the substrate from the patterned organic semiconductor layer, and forming a source/drain electrode on the patterned organic semiconductor layer. A pattern of the patterned lyophobic area of the sacrificial layer and a pattern of the patterned organic semiconductor layer are same or complementary to each other. The insulating layer is an organic insulating layer. The source/drain electrode is a patterned nano silver wire or patterned carbon nanotube.

In an embodiment of the present disclosure, the method further includes etching the sacrificial layer by using a fluorine-containing gas.

In an embodiment of the present disclosure, the method further includes performing the patterned surface treatment to the sacrificial layer by using octadecyltrichlorosilane (OTS).

In an embodiment of the present disclosure, the method further includes forming an organic substrate on the gate electrode.

An embodiment of the present disclosure further provides a substrate, forming a sacrificial layer on the substrate, forming a patterned organic semiconductor layer on the sacrificial layer, forming an insulating layer on the patterned organic semiconductor layer, forming a gate electrode on the insulating layer, separating the sacrificial layer and the substrate from the patterned organic semiconductor layer, and forming a source/drain electrode on the patterned organic semiconductor layer In an embodiment of the present disclosure, the method further includes performing a patterned surface treatment to the sacrificial layer.

In an embodiment of the present disclosure, the method further includes etching the sacrificial layer by using a fluorine-containing gas.

In an embodiment of the present disclosure, the method further includes performing the patterned surface treatment to the sacrificial layer by using octadecyltrichlorosilane.

In an embodiment of the present disclosure, the method further includes forming a patterned lyophobic area on the sacrificial layer.

In an embodiment of the present disclosure, a pattern of the patterned lyophobic area of the sacrificial layer and a pattern of the patterned organic semiconductor layer are same.

In an embodiment of the present disclosure, a pattern of the patterned lyophobic area of the sacrificial layer and a pattern of the patterned organic semiconductor layer are complementary to each other.

In an embodiment of the present disclosure, the method further includes forming an organic substrate on the gate electrode.

In an embodiment of the present disclosure, the insulating layer is an organic insulating layer.

In an embodiment of the present disclosure, the source/drain electrode is a patterned nano silver wire or patterned carbon nanotube.

Since the method of manufacturing the organic semiconductor device in the embodiment of the present disclosure includes providing the substrate, forming the sacrificial layer on the substrate, forming the patterned organic semiconductor layer on the sacrificial layer, forming the insulating layer on the patterned organic semiconductor layer, forming the gate electrode on the insulating layer, separating the sacrificial layer and the substrate from the patterned organic semiconductor layer, and forming the source/drain electrode on the patterned organic semiconductor layer, so as to provide a simple and effective method of manufacturing the organic semiconductor device.

In order to make the above-mentioned contents of the present disclosure more comprehensible, preferred embodiments accompanied with drawings are described in detail as follows.

Figure 1:
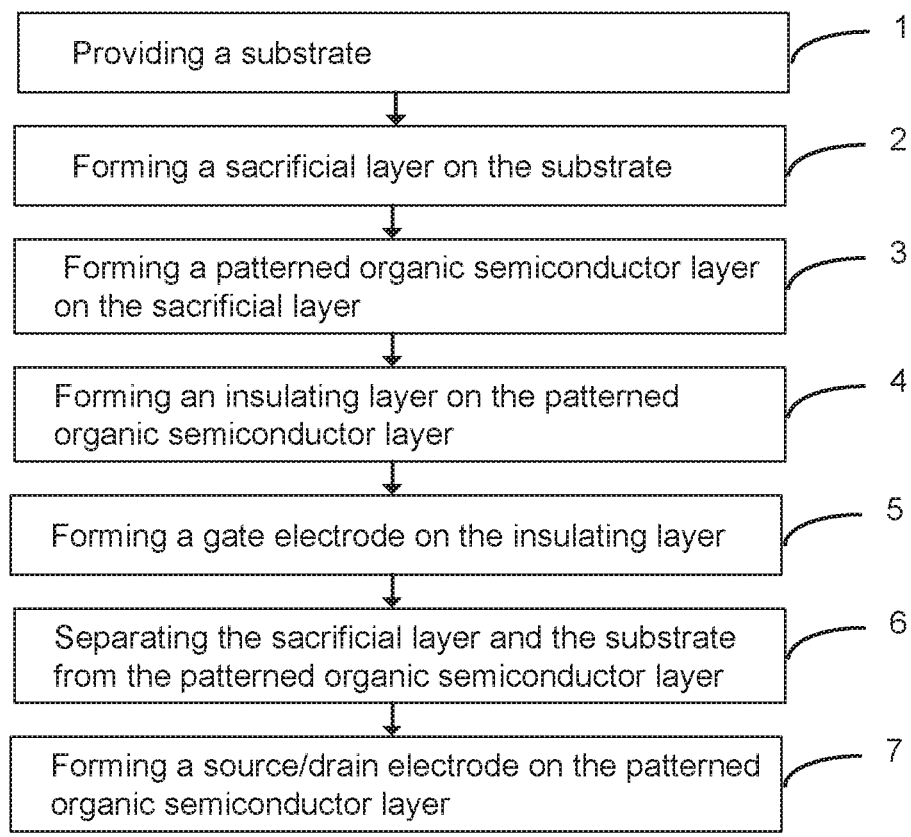
FIG. 1 is a flowchart of a method of manufacturing an organic semiconductor device according to an embodiment of the present disclosure.

DESCRIPTION OF SPECIFIC EMBODIMENTS
OF THE INVENTION

The embodiments described herein with reference to the accompanying drawings are explanatory, illustrative, and used to generally understand the present disclosure. Furthermore, directional terms described by the present disclosure, such as up, down, top, bottom, front, back, left, right, inner, outer, side, surrounding, center, horizontal, lateral, vertical, longitudinal, axial, radial, top layer, bottom layer, etc., are only directions by referring to the accompanying drawings, and thus the used terms are used only for the purpose of describing embodiments of the present disclosure and are not intended to be limiting of the present disclosure.

In the drawings, modules with similar structures are labeled with the same reference number.

Refer to FIG. 1, a flowchart of a method of manufacturing an organic semiconductor device according to an embodiment of the present disclosure is provided. The method includes the following steps.

Figure 2:
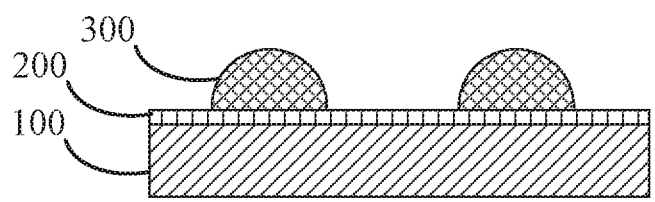
FIG. 2 is a schematic diagram of a method of manufacturing an organic semiconductor device according to an embodiment of the present disclosure.

Refer to FIGS. 1 and 2, in step 1, a substrate 100 is provided. A material of the substrate 100 includes, for example, silicon (Si) or silicon dioxide (SiO2).

In step 2, a sacrificial layer 200 is formed on the substrate 100.

In details, entire sacrificial layer 200 is formed on the substrate 100. A patterned surface treatment to the sacrificial layer 200 is performed. A patterned lyophobic area is formed on the sacrificial layer 200. In an embodiment, the sacrificial layer 200 is etched by using a fluorine-containing gas. In another embodiment, a patterned surface treatment to the sacrificial layer 200 is performed by using octadecyltrichlorosilane (OTS).

In step 3, a patterned organic semiconductor layer 300 is formed on the sacrificial layer 200.

In details, in an embodiment, a pattern of the patterned lyophobic area of the sacrificial layer 200 and a pattern of the patterned organic semiconductor layer 300 are same. In another embodiment, a pattern of the patterned lyophobic area of the sacrificial layer 200 and a pattern of the patterned organic semiconductor layer 300 are complementary to each other.

In details, a patterned surface treatment to the surface of the sacrificial layer 200 is performed by means of printing, and a solution of the organic semiconductor layer 300 and the surface of the sacrificial layer 200 have a difference between hydrophilicity and hydrophobicity due to a patterned surface pretreatment to the surface of the sacrificial layer 200. Therefore, the organic semiconductor layer 300 is easy to gather out a patterned shape. Then, heating or ultraviolet curing the solution of the semiconductor layer 300 is performed to form the patterned organic semiconductor layer 300.

Figure 3:
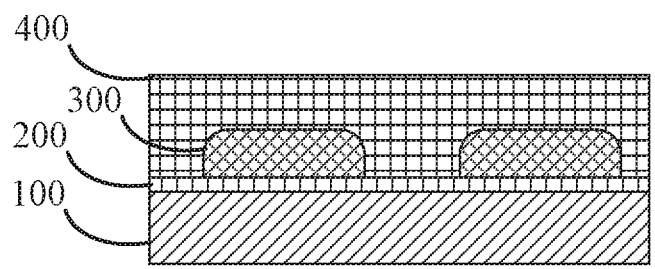
FIG. 3 is a schematic diagram of a method of manufacturing an organic semiconductor device according to an embodiment of the present disclosure.

Refer to FIGS. 1 and 3, in step 4, an insulating layer 400 is formed on the patterned organic semiconductor layer 300.

In details, the insulating layer 400 is an organic insulating layer.

In details, after the organic semiconductor layer 300 is formed, other functional layers can be formed, for example, the insulating layer 400 is formed on an entire surface of the organic semiconductor layer 300.

Figure 4:
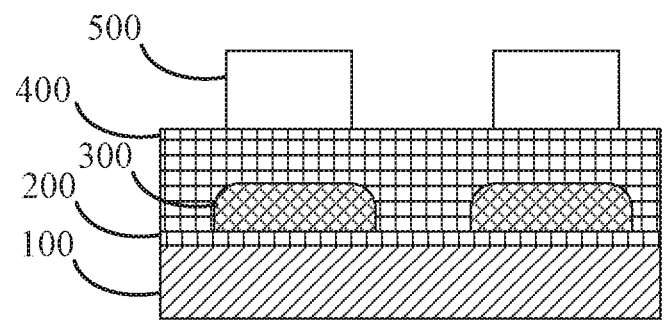
FIG. 4 is a schematic diagram of a method of manufacturing an organic semiconductor device according to an embodiment of the present disclosure.

Refer to FIGS. 1 and 4, in step 5, a gate electrode 500 is formed on the insulating layer 400.

Figure 5:
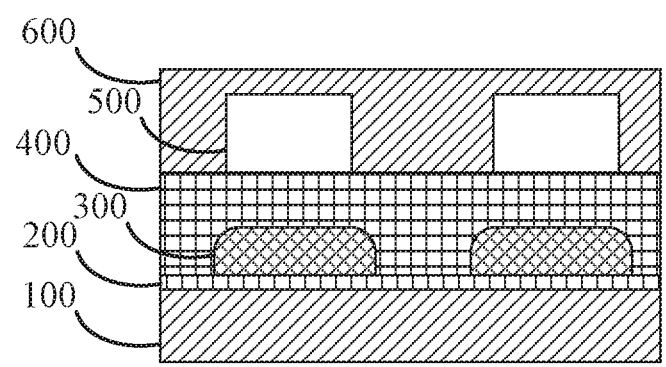
FIG. 5 is a schematic diagram of a method of manufacturing an organic semiconductor device according to an embodiment of the present disclosure.

Refer to FIGS. 1 and 5, in step 6, the sacrificial layer 200 and the substrate 100 are separated from the patterned organic semiconductor layer 300.

In details, the substrate 100 is peeled off by using the sacrificial layer 200, such that the organic semiconductor layer 300 is exposed.

In details, the method further includes forming an organic substrate 600 on the gate electrode 500. In details, a polyimide (PI) substrate is formed as an organic substrate 600, for example, by a coating method. A polystyrene-block-ethlene-block-styrene (SEBS) substrate is used as the organic substrate 600, for example, by a coating method.

Figure 6:
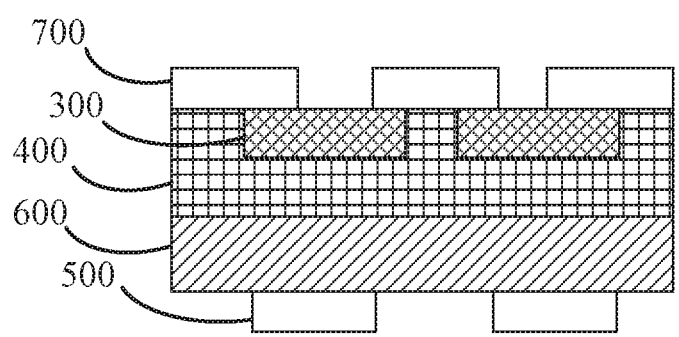
FIG. 6 is a schematic diagram of a method of manufacturing an organic semiconductor device according to an embodiment of the present disclosure.

Refer to FIGS. 1 and 6, in step 7, a source/drain electrode 700 is formed on the patterned organic semiconductor layer 300.

In details, the source and drain electrode 700 is a patterned nano silver wire or patterned carbon nanotube.

Features of embodiments of the present disclosure include forming the patterned organic semiconductor layer 300 on the substrate 100 and then forming the insulating layer 400 on the patterned organic semiconductor layer 300. The organic semiconductor layer 300 can be effectively protected by an entire surface of the insulating layer 400 when the gate electrode 500 is formed. Thereafter, the substrate 100 is peeled off to expose the organic semiconductor layer 300 and the source/drain electrode 700 contacting the organic semiconductor layer 300 is formed. The manufacturing method of the organic semiconductor device in the embodiment of the present disclosure is simple and effective, and is advantageous in improving efficiency in mass production of flexible electronic devices.

So far, the manufacturing method of the organic semiconductor device has been completed. The organic semiconductor device is, for example, a flexible organic semiconductor device.

Since the method of manufacturing the organic semiconductor device in the embodiment of the present disclosure includes providing the substrate, forming the sacrificial layer on the substrate, forming the patterned organic semiconductor layer on the sacrificial layer, forming the insulating layer on the patterned organic semiconductor layer, forming the gate electrode on the insulating layer, separating the sacrificial layer and the substrate from the patterned organic semiconductor layer, and forming the source/drain electrode on the patterned organic semiconductor layer, so as to provide a simple and effective method of manufacturing the organic semiconductor device.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components, the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

The above descriptions are merely preferred implementations of the present disclosure, it should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A method of manufacturing an organic semiconductor device, comprising:
    providing a substrate;
    forming a sacrificial layer on the substrate;
    performing a patterned surface treatment to the sacrificial layer and forming a patterned lyophobic area on the sacrificial layer;
    forming a patterned organic semiconductor layer on the sacrificial layer, wherein a pattern of the patterned lyophobic area of the sacrificial layer and a pattern of the patterned organic semiconductor layer are same or complementary to each other;
    forming an insulating layer on the patterned organic semiconductor layer, wherein the insulating layer is an organic insulating layer;
    forming a gate electrode on the insulating layer;
    separating the sacrificial layer and the substrate from the patterned organic semiconductor layer; and
    forming a source/drain electrode on the patterned organic semiconductor layer, wherein the source/drain electrode is a patterned nano silver wire or patterned carbon nanotube.

2. The method of manufacturing the organic semiconductor device according to claim 1, further comprising etching the sacrificial layer by using a fluorine-containing gas.

3. The method of manufacturing the organic semiconductor device according to claim 1, further comprising performing the patterned surface treatment to the sacrificial layer by using octadecyltrichlorosilane.

4. The method of manufacturing the organic semiconductor device according to claim 1, further comprising forming an organic substrate on the gate electrode.

5. A method of manufacturing an organic semiconductor device, comprising:
    providing a substrate;
    forming a sacrificial layer on the substrate;
    forming a patterned organic semiconductor layer on the sacrificial layer;
    forming an insulating layer on the patterned organic semiconductor layer;
    forming a gate electrode on the insulating layer;
    separating the sacrificial layer and the substrate from the patterned organic semiconductor layer; and
    forming a source/drain electrode on the patterned organic semiconductor layer;
    performing a patterned surface treatment to the sacrificial layer; and
    forming a patterned lyophobic area on the sacrificial layer;
    wherein a pattern of the patterned lyophobic area of the sacrificial layer and a pattern of the patterned organic semiconductor layer are same.

6. The method of manufacturing the organic semiconductor device according to claim 5, further comprising etching the sacrificial layer by using a fluorine-containing gas.

7. The method of manufacturing the organic semiconductor device according to claim 5, further comprising performing the patterned surface treatment to the sacrificial layer by using octadecyltrichlorosilane.

8. The method of manufacturing the organic semiconductor device according to claim 5, further comprising forming an organic substrate on the gate electrode.

9. The method of manufacturing the organic semiconductor device according to claim 5, wherein the insulating layer is an organic insulating layer.

10. The method of manufacturing the organic semiconductor device according to claim 5, wherein the source/drain electrode is a patterned nano silver wire or patterned carbon nanotube.

11. A method of manufacturing an organic semiconductor device, comprising:
    providing a substrate;
    forming a sacrificial layer on the substrate;
    forming a patterned organic semiconductor layer on the sacrificial layer;
    forming an insulating layer on the patterned organic semiconductor layer;
    forming a gate electrode on the insulating layer;
    separating the sacrificial layer and the substrate from the patterned organic semiconductor layer; and
    forming a source/drain electrode on the patterned organic semiconductor layer;
    performing a patterned surface treatment to the sacrificial layer; and
    forming a patterned lyophobic area on the sacrificial layer;
    wherein a pattern of the patterned lyophobic area of the sacrificial layer and a pattern of the patterned organic semiconductor layer are complementary to each other.

12. The method of manufacturing the organic semiconductor device according to claim 11, further comprising etching the sacrificial layer by using a fluorine-containing gas.

13. The method of manufacturing the organic semiconductor device according to claim 11, further comprising performing the patterned surface treatment to the sacrificial layer by using octadecyltrichlorosilane.

14. The method of manufacturing the organic semiconductor device according to claim 11, further comprising forming an organic substrate on the gate electrode.

15. The method of manufacturing the organic semiconductor device according to claim 11, wherein the insulating layer is an organic insulating layer.

16. The method of manufacturing the organic semiconductor device according to claim 11, wherein the source/drain electrode is a patterned nano silver wire or patterned carbon nanotube.

* * * * *